United States Patent [19]

Bergeron et al.

[11] 4,446,611

[45] May 8, 1984

[54] METHOD OF MAKING A SATURATION-LIMITED BIPOLAR TRANSISTOR DEVICE

[75] Inventors: David L. Bergeron, Winooski, Vt.; Parsotam T. Patel, Round Rock, Tex.

[73] Assignee: International Business Machines Corporation, Armonk, N.Y.

[21] Appl. No.: 468,442

[22] Filed: Feb. 22, 1983

Related U.S. Application Data

[62] Division of Ser. No. 163,035, Jun. 26, 1980, Pat. No. 4,390,890.

[51] Int. Cl.³ .......................................... H01L 21/225
[52] U.S. Cl. ................................... 29/578; 29/576 B; 148/1.5; 148/187; 148/188
[58] Field of Search ............... 29/576 B, 578; 148/1.5, 148/187, 188; 357/44, 46, 34, 35

[56] References Cited

U.S. PATENT DOCUMENTS

| | | | |
|---|---|---|---|
| 3,693,032 | 9/1972 | Winnard | 307/299 |
| 3,821,776 | 6/1974 | Hayashi et al. | 357/42 X |
| 4,021,687 | 5/1977 | Yoshimura | 307/300 |
| 4,058,419 | 11/1977 | Tokamaru et al. | 148/175 |
| 4,064,526 | 12/1977 | Tokumaru et al. | 357/46 |
| 4,069,428 | 1/1978 | Reedy | 307/125 |
| 4,110,126 | 8/1978 | Bergeron et al. | 148/1.5 |
| 4,190,466 | 2/1980 | Bhattacharyya et al. | 148/1.5 |

OTHER PUBLICATIONS

IBM Technical Disclosure Bulletin, vol. 22 No. 2, Jul. 1979, by R. Remshardt et al. on pp. 617–618 "Active Injection Memory Cell".

Primary Examiner—Brian E. Hearn
Assistant Examiner—Alan E. Schiavelli
Attorney, Agent, or Firm—Stephen J. Limanek

[57] ABSTRACT

A saturation-limited bipolar transistor device or circuit and a method of making same are provided which includes a merged NPN transistor and a PNP transistor structure formed so as to produce denser cells or circuits. A simple process is used to form the structure which includes a double diffused technique for making the PNP transistor. The PNP transistor has a double diffused emitter-base arrangement wherein the emitter is asymmetrically positioned with respect to the base so as to also serve as a contact for the base of the NPN transistor. The PNP transistor limits the input current by bypassing excess current to a silicon semiconductor substrate or chip. The structure includes an N type epitaxial layer formed on an N type subcollector with a P type region provided near the surface of the epitaxial layer. The epitaxial layer serves as the NPN collector and as the PNP base contact region. A first N typ region is formed through the P type region extending from the surface of the epitaxial layer to the subcollector dividing the P type region into first and second sections which serve as the PNP collector region and the NPN base region, respectively. A second N type region is formed in the second section of the P type region at the surface of the epitaxial layer acting as the NPN emitter and a P+ region is formed in the first N type region at the surface of the epitaxial layer extending into the second section of the P type region which forms the NPN transistor base. This P+ region serves as the PNP emitter and as the NPN base contact.

12 Claims, 5 Drawing Figures

METHOD OF MAKING A SATURATION-LIMITED BIPOLAR TRANSISTOR DEVICE

This application is a division of application Ser. No. 163,035, filed June 26, 1980 now U.S. Pat. No. 4,390,890.

DESCRIPTION

TECHNICAL FIELD

This invention relates to integrated semiconductor circuits and more particularly to saturation-limited bipolar transistor logic circuits.

BACKGROUND ART

Transistor transistor logic (T$^2$L) circuits are widely used because they offer a good trade-off between performance, power dissipation, functional density on a monolithic chip and logic flexibility. However, in the circuits high drive currents are used to drive the output transistor hard in order to obtain a fast turn on transition. The high drive currents cause excessive charge to be stored in the output transistor thereby resulting in heavy saturation of the output transistor and a consequent long turn off delay for the T$^2$L circuit.

A number of methods have been proposed to prevent deep saturation in the output transistor. One proposal uses a Schottky barrier diode in shunt with the base-collector junction of the transistor to clamp the voltage across the base-collector junction at a relatively low forward voltage. A disadvantage of this technique is that there is additional process complexity in making the Schottky diode when metals are used for the metallic interconnections in required cell areas, and there are some noise problems due to the fact that the characteristics of the transistor of the T$^2$L circuit and those of the antisaturation Schottky diode do not track each other in the manner of transistors formed on the same monolithic chip. An example of a circuit using a Schottky barrier diode in shunt with the base-collector junction of a transistor to clamp the voltage across the base-collector junction may be found in commonly assigned U.S. Pat. No. 4,069,428 filed by D. C. Reedy on Sept. 2, 1976.

A proposal which does not require the use of Schottky barrier diodes is disclosed in commonly assigned U.S. Pat. No. 3,693,032 filed by J. R. Winnard on Apr. 23, 1971 which discloses a T$^2$L circuit utilizing an extra emitter of the input NPN device connected to the collector of the output NPN device for saturation control, to take advantage of tracking characteristics in devices formed on the same monolithic chip.

In U.S. Pat. No. 4,021,687 filed Nov. 5, 1975 there is described a circuit for deep saturation prevention which has a PNP transistor merged with an NPN transistor to prevent saturation in the NPN transistor. As stated in this patent, a P type region serves as the base of the NPN transistor and as the emitter of the lateral PNP transistor, while an N type epitaxial layer serves as the collector of the NPN transistor and the base of the lateral PNP transistor.

An integrated injection logic (I$^2$L) circuit or merged transistor logic (MTL) circuit using a PNP transister merged with an NPN transistor is disclosed in IBM Technical Disclosure Bulletin Vol. 22 No. 2 July 1979 by R. Remshardt et al on pp. 617-618.

Circuits imploying double diffused PNP transistors and doped polysilicon sources and contacts for bipolar transistors are also known. U.S. Pat. Nos. 4,064,526 and 4,058,419, both filed Dec. 24, 1975, disclose a structure and a process, respectively, for a double diffused PNP transistor. In both patents the double diffused PNP emitter is formed within the base region, and a P epitaxial layer serves as a collector. Commonly assigned U.S. Pat. No. 4,110,126, filed on Aug. 31, 1977 by D. L. Bergeron et al discloses a structure where a double diffused PNP transistor is formed in an N− epitaxial layer having a P− implant serving as the PNP collector. Commonly assigned U.S. Pat. No. 4,190,466, filed on Dec. 22, 1977 by A. Bhattacharyya et al, discloses a bipolar transistor structure wherein first and second doped polysilicon layers are used as sources for the base contact and emitter, respectively, of a bipolar transistor.

DISCLOSURE OF THE INVENTION

It is an object of this invention to provide an improved saturation-limited bipolar transistor integrated circuit.

It is another object of this invention to provide an improved saturation-limited bipolar transistor integrated circuit which does not require the use of a Schottky barrier diode to avoid saturation and increases the number of wiring channels per unit area.

It is yet another object of this invention to provide an improved saturation-limited compact bipolar transistor circuit using doped polysilicon as a diffusion source and as a contact.

It is a further object of this invention to provide a fast T$^2$L circuit or gate using a merged double diffused PNP transistor to limit saturation in an NPN transistor and to increase fan out capacity.

It is yet a further object of this invention to provide a fast T$^2$L circuit or gate which does not require use of special processing steps or techniques.

It is still a further object of this invention to provide a saturation-limited bipolar transistor device in which active device regions are shared.

In accordance with the teachings of this invention a saturation-limited bipolar transistor device or circuit and a method of making same are provided which includes a merged NPN transistor and a PNP transistor structure formed so as to produce denser cells or circuits. A simple process is used to form the structure which includes a double diffused technique for making the PNP transistor. This double diffused PNP transistor limits the input current by bypassing excess current to the semiconductor substrate or chip. The structure includes an N type epitaxial layer formed on an N type subcollector with a P type region provided near the surface of the epitaxial layer. The epitaxial layer serves as the NPN collector and as the PNP base contact region. A first N type region is formed through the P type region extending from the surface of the epitaxial layer to the subcollector dividing the P type region into first and second sections which serve as the PNP collector region and the NPN base region, respectively. A second N type region is formed in the second section of the P type region at the surface of the epitaxial layer acting as the NPN emitter and a P+ region is formed in the first N type region at the surface of the epitaxial layer extending into the second section of the P type region which forms the NPN transistor base. This P+ region serves as the PNP emitter and as the NPN base contact. The separation, which may be about 0.5 microns, between the P+ region and the first P type section by the first N type region serves as the PNP base, thus providing excellent control over the device current gain and switching speed due to the use of double diffusion techniques.

This structure is made simply by forming an N+ subcollector and an N− epitaxial layer in a known manner and then growing a layer of silicon dioxide on the epitaxial layer followed by the deposition of a layer of silicon nitride. A first mask is then used for defining an opening in the silicon nitride and silicon dioxide layers. A blocking mask is next provided to define only a portion of the opening in the silicon nitride and silicon dioxide layers with the remaining area being covered with a photo resist. An N+ region is formed in the epitaxial layer by, e.g., ion implanting through the opening in the photo resist. This N+ region extends from the surface of the epitaxial layer to the N+ subcollector. All of the photo resist is now removed and a layer of P+ doped polysilicon is deposited and appropriately etched so as to cover the opening in the silicon dioxide and silicon nitride layers. The dopant in the polysilicon layer is then diffused into the epitaxial layer to form a P+ region within the upper portion of the N+ region so as to extend beyond one side of the N+ region. By the appropriate use of a blocking mask and known ion implantation techniques P regions may be formed on both sides of the N+ and P+ regions in the epitaxial layer. The P+ region may now be used as the PNP emitter and as the contact for the NPN base in a merged NPN/PNP structure for use to provide fast and dense logic circuits.

If ion implantation techniques are not preferred for forming the N+ region, an alternative method may be used, i.e., a first mask defining an opening in the silicon nitride layer followed by the block masking and subsequent silicon dioxide etch would allow the N+ region to be formed by conventional diffusion techniques. The remaining oxide within the silicon nitride opening would be removed by a silicon dioxide etch prior to the formation of the P+ region.

The foregoing and other objects, features and advantages of the invention will be apparent from the following more particular description of the preferred embodiments of the invention, as illustrated in the accompanying drawings.

BEST MODE FOR CARRYING OUT THE INVENTION

Figure 1:
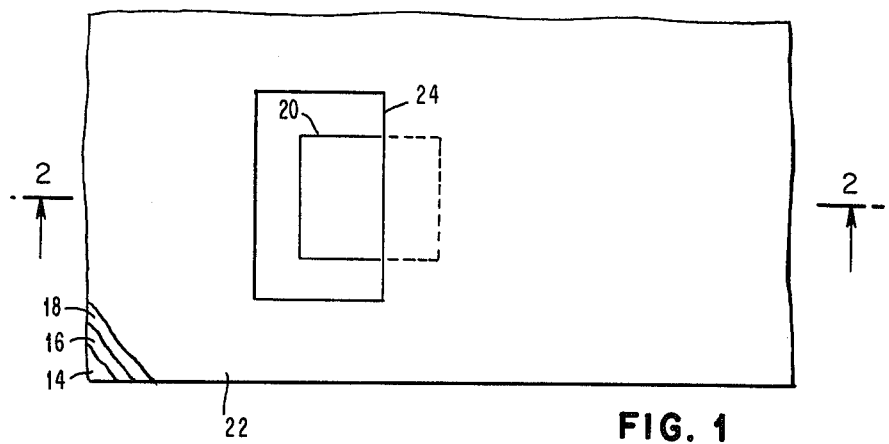
FIG. 1 is a plan view of the structure of the present invention during an early step in the processing thereof.
Figure 2:
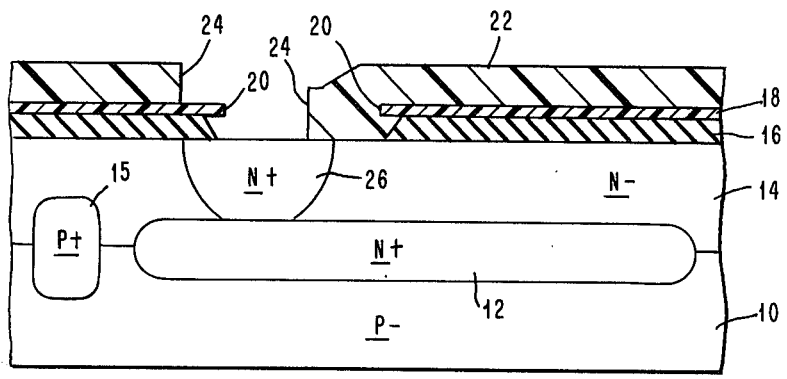
FIG. 2 is a sectional view of the structure taken through line 2—2 of FIG. 1.

Referring to the drawings in more detail, there is illustrated in plan view in FIG. 1 and in a sectional view in FIG. 2 taken through line 2—2 of FIG. 1, the structure of the present invention during the early stages of the process for making this structure. The structure includes a P− semiconductor substrate 10 in which there is formed an N+ subcollector 12 and an N− epitaxial layer 14 disposed thereover. Isolation regions 15 may also be formed as needed at the interface between substrate 10 and epitaxial layer 14, as is known. A layer of silicon dioxide 16 is preferably grown over the epitaxial layer 14 and a layer of silicon nitride 18 is deposited on silicon dioxide layer 16. By the use of a suitable mask an opening 20 is formed in the silicon dioxide and silicon nitride layers 16 and 18, respectively. A layer of photo resist 22 is then deposited over the silicon nitride layer 18 and into the opening 20. By the use of another suitable mask, which is simply a blocking mask, an opening 24 is formed in the photo resist layer 22 which coincides with only a portion of the opening 20. Through the opening 24 phosphorus or N type dopant may be introduced by ion implantation into the epitaxial layer 14 to form an N+ region 26 which after subsequent heat cycles extends from the surface of the epitaxial layer 14 to the N+ subcollector 12.

Figure 3:
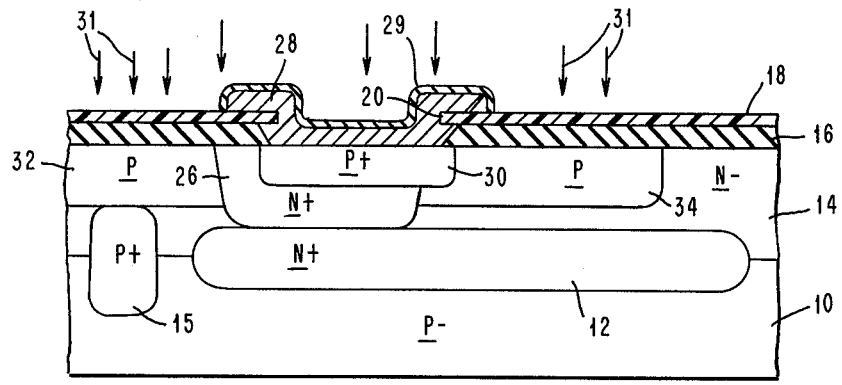
FIG. 3 is a sectional view of the structure of the present invention similar to that of FIG. 2 but at a later stage in the processing thereof.

The photo resist layer 22 is stripped off and a layer of P+ doped polysilicon is deposited over the silicon nitride layer 18 and into opening 20. By the use of known techniques, the polysilicon layer is etched to form a polysilicon segment 28 covering substantially only the opening 20, as illustrated in FIG. 3 of the drawings. The polysilicon segment 28 is then oxidized to form an insulating layer 29 and the P+ impurity in the segment 28 is driven into the epitaxial layer 14 to form a P+ region 30 in the N+ region 26 extending at one end outside of the N+ region 26. By known implantation techniques and appropriate masking, boron, indicated by arrows 31, is introduced into the epitaxial layer 14 to form first and second P regions 32 and 34, respectively, with the first P region 32 contacting the isolation region 15.

Figure 4:
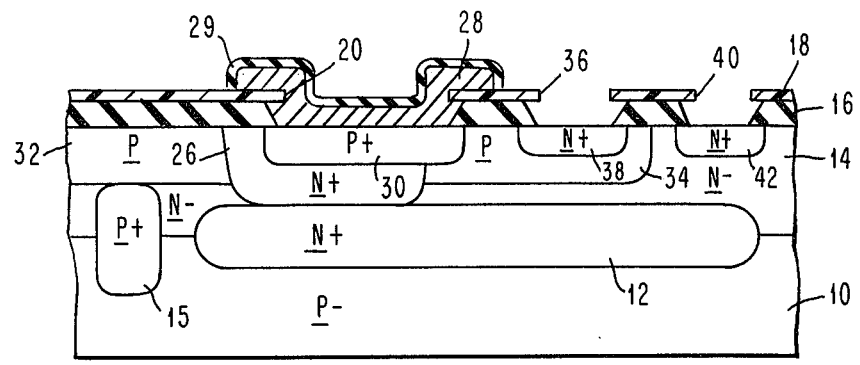
FIG. 4 is a sectional view of the structure of the present invention similar to that of FIG. 3 but taken during an advance stage of the processing.

As indicated in FIG. 4 of the drawings, an opening 36 is made in the silicon dioxide and silicon nitride layers, 16 and 18, respectively, through which arsenic or other N type dopant is introduced into the second P region to form therein an N+ region 38 and an opening 40 is made in the silicon dioxide and silicon nitride layers, 16 and 18, respectively, through which arsenic is introduced into the N− epitaxial layer 14 to form an N+ contact region 42. For improved alignment, openings 36 and 40 through the silicon nitride layer could be formed by the same masking layer which defined opening 20 in a manner similar to the technique disclosed in hereinabove mentioned U.S. Pat. No. 4,110,126.

The concentrations of dopants in the various regions of the structure of the present invention illustrated in FIG. 4 of the drawings are preferably as follows: approximately $1 \times 10^{19}$ to $3 \times 10^{20}$ boron atoms per cubic centimeter for P+ region 30, $1 \times 10^{16}$ to $5 \times 10^{17}$ boron atoms per cubic centimeter for first and second P regions 32 and 34, $1 \times 10^{18}$ phosphorous atoms per cubic centimeter for N+ region 26, more than $1 \times 10^{20}$ arsenic atoms per cubic centimeter for N+ regions 38 and 42, $1 \times 10^{16}$ arsenic atoms per cubic centimeter for N− epitaxial layer 14, $1 \times 10^{19}$ arsenic atoms per cubic centimeter for the N+ subcollector 12, $1 \times 10^{19}$ boron atoms for isolation region 15 and $1 \times 10^{15}$ boron atoms for semiconductor substrate 10.

The structure illustrated and described hereinabove in connection with FIGS. 1–4 of the drawings may be used advantageously in, e.g., T$^2$L logic circuits of the type illustrated in FIG. 5 of the drawings. This logic circuit includes an input NPN transistor T1 having a plurality of emitters connected to a like plurality of input terminals and a base and a collector connected to the emitter and base, respectively, of an input clamping PNP transistor P1. The collector of the PNP transistor P1 is connected to a point of reference potential, such as ground. An output NPN transistor T2 has a collector connected to an output terminal, a base connected to the collector of input transistor T1 and an emitter connected to ground. An output clamping PNP transistor P2 has an emitter connected to the base of the output transistor T2, a base connected to the collector of output transistor T2 and a collector connected to ground. A first load resistor R1 is connected between a source of supply potential VCC and the base of input transistor T1, a second load resistor R2 is connected between the source of supply potential VCC and the base of output transistor T2 and a third load resistor R3 is connected between the source of supply potential VCC and the collector of output transistor T2.

Figure 5:
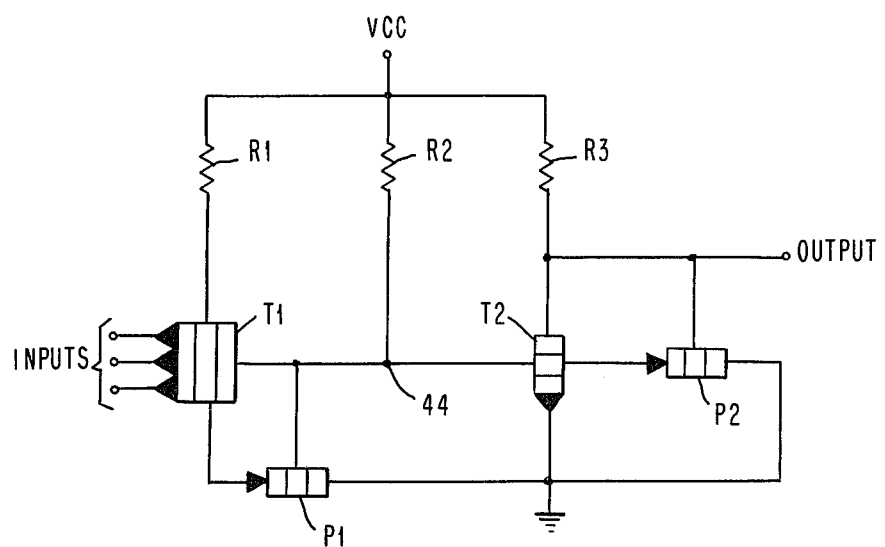
FIG. 5 is a diagram of a T$^2$L circuit that utilized effectively the structure of the present invention.

In the operation of the circuit of FIG. 5 of the drawings, when all input voltages are up the input transistor T1 is off, pulling node 44 up and turning output NPN transistor T2 on with the output node low. The PNP transistor P2 turns on keeping transistor T2 out of deep saturation, thus providing improved performance. when one or more of the input voltages is low the input transistor T1 is on, pulling node 44 low and turning the output NPN transistor T2 off. The PNP transistor P1 turns on when T1 is on keeping T1 out of deep saturation, thus again providing improved performance.

Referring now back to FIG. 4 of the drawings, it can be seen that the sectional view represents a merged arrangement of the output NPN transistor T2 and the output clamping PNP transistor P2 or the input clamping PNP transistor P1 and the input NPN transistor T1, but illustrating only one of the plurality of emitters of transistor T1, shown in FIG. 5 of the drawings. It can be seen that the clamping PNP transistor P1 or P2 is represented in FIG. 4 by the P+ emitter region 30, N+ base region 26 and the first P collector region 32 and that the input NPN transistor T1 or the output NPN transistor T2 is represented by the N+ emitter region 38, second P base region 34 and the N+ collector region 26.

It should be noted that with proper adjustment of both the doping levels in N+ region 26 and P+ region 30 and the emitter area of the PNP transistor, the PNP transistors P1 and P2 are designed to turn on prior to the turn on of the collector-base junction of NPN transistors T1 and T2, thus keeping the NPN transistors T1 and T2 out of deep saturation.

It can also be seen that polysilicon segments 28 of FIG. 4 can be used conveniently as the contact to the resistor R1 from the base of the input transistor T1 and as the contact to the resistor R2 from the base of the output transistor T2 shown in FIG. 5. Metal contacts, such as aluminum-copper-silicon, may be used between the collector of the input transistor T1 and the base of output transistor T2 and the collector of output transistor T2 and the resistor R3. Such metal contacts may be applied to N+ regions 36 and 42.

It should also be noted that the second P section 34 may be used as a buried resistor directly connected to the emitter of a PNP transistor having emitter region 30, base region 26 and collector region 32 forming a very compact structure requiring only one contact hole.

Accordingly, it can be seen that the present invention has many advantages over the structures disclosed in the prior art, which include: (1) The use of a double diffused PNP transistor to limit the saturation of a NPN transistor resulting in improved performance over conventional lateral PNP transistor designs since the PNP transistor base width is defined by lateral diffusions and not by photo lithography. This manifests itself in improved control over the PNP transistor and hence the circuit saturation characteristics and resulting speed; (2) The double diffused PNP limits the down level input current by bypassing excess current to the substrate and hence increasing the fanout capability of logic circuits; (3) The use of a double diffused PNP transistor with a P+ polysilicon emitter eliminates the use of contact metalization and allows metal to be wired over the NPN transistor base contacts, or PNP emitter, thus allowing additional cell or circuit area to be used for intercell wiring, increasing the productivity by increasing the wiring channels available in each cell or circuit; and (4) The use of a double diffused PNP transistor with P+ polysilicon simultaneously providing an improved merged cell structure and an improved double diffused PNP transistor characteristics.

While the invention has been particularly shown and described with reference to preferred embodiments thereof, it will be understood by those skilled in the art that various changes in form and details may be made therein without departing from the spirit and scope of the invention.

What is claimed is:

1. A method of making a PNP transistor structure which includes the steps of;

forming a subcollector in a semiconductor substrate, depositing a layer of silicon dioxide on the surface of said substrate, depositing a layer of silicon nitride on said silicon dioxide layer, defining an opening in said silicon nitride layer, introducing a first dopant through a portion of the area of said opening to form an N+ region in said substrate extending from said subcollector to the surface of said substrate, introducing a second dopant through the entire area of said opening to form a P+ region at the surface of said substrate, said P+ region having one end extending outside of said N+ region, and forming a P region having a first section on one side of said N+ region and a second section on the opposite side of said N+ region and in contact with said P+ region, the maximum dopant concentration of said P region being approximately between $1 \times 10^{16}$ and $5 \times 10^{17}$ boron atoms per cubic centimeter and that of said P+ region being approximately between $1 \times 10^{19}$ and $3 \times 10^{20}$ boron atoms per cubic centimeter.

2. A method as set forth in claim 1 wherein said opening is also defined in said silicon dioxide layer and said second dopant is introduced through said opening from a layer of doped polysilicon.

3. A method as set forth in claim 2 wherein said N+ region and said P region are formed by ion implantation techniques.

4. A method of making a PNP transistor structure which includes the steps of;

forming a subcollector in a semiconductor substrate, depositing a layer of silicon dioxide on the surface of said substrate, depositing a layer of silicon nitride on said silicon dioxide layer, defining an opening in said silicon nitride layer, introducing a first dopant through a portion of the area of said opening to form an N+ region in said substrate extending from said subcollector to the surface of said substrate, introducing a second dopant through the entire area of said opening to form a P+ region at the surface of said substrate, said P+ region having one end extending outside of said N+ region, and forming a P region having a first section on one side of said N+ region and a second section on the opposite side of said N+ region and in contact with said P+ region, the dopant concentration of said P region being less than that of said first dopant and the dopant concentration of said P+ region being greater than that of said first dopant.

5. A method as set forth in claim 4 wherein said opening is also defined in said silicon dioxide layer and said second dopant is introduced through said opening from a layer of doped polysilicon.

6. A method as set forth in claim 5 wherein said N+ region and said P region are formed by ion implantation.

7. A method as set forth in claim 5 wherein said layer of polysilicon is oxidized to form an insulating layer thereon.

8. A method of making a PNP transistor structure which includes the steps of;

forming a subcollector in a semiconductor substrate, depositing a layer of silicon dioxide on the surface of said substrate, depositing a layer of silicon nitride on said silicon dioxide layer, defining an opening in said silicon nitride layer and in said silicon dioxide layer to expose a portion of the surface of said substrate, introducing a first dopant through a portion of the area of said opening to form an N+ region in said substrate extending from said subcollector to the surface of said substrate, depositing a layer of polysilicon having a P+ dopant therein on said layer of silicon nitride and through the entire area of said opening to the exposed surface of said substrate, driving said P+ dopant from said layer of polysilicon to the exposed surface of said substrate to form a P+ region at the surface of said substrate said P+ region having one end extending outside of said N+ region, and forming a P region having a first section on one side of said N+ region and a second section on the opposite side of said N+ region and in contact with said P+ region, the dopant concentration of said P region being less than that of said first dopant and the dopant concentration of said P+ region being greater than that of said first dopant.

9. A method as set forth in claim 8 wherein said N+ region and said P region are formed by ion implantation.

10. A method as set forth in claim 8 wherein said first dopant is phosphorous and said second P+ dopant is boron.

11. A method as set forth in claim 10 wherein said P region is formed by implanting boron ions and a second N+ region is formed in the second section of said P region.

12. A method as set forth in claim 8 wherein a layer of photoresist is deposited over said layer of silicon nitride and into said opening, said layer of photoresist having a second opening superimposed over one side of said opening in said silicon nitride layer before introducing said first dopant.

* * * * *